(12) United States Patent
Stirton

(10) Patent No.: US 6,479,200 B1
(45) Date of Patent: Nov. 12, 2002

(54) METHOD OF CONTROLLING STEPPER PROCESS PARAMETERS BASED UPON SCATTEROMETRIC MEASUREMENTS OF DICD FEATURES

(75) Inventor: James Broc Stirton, Austin, TX (US)

(73) Assignee: Advanced Micro Devices, Inc., Austin, TX (US)

( * ) Notice: Subject to any disclaimer, the term of this patent is extended or adjusted under 35 U.S.C. 154(b) by 0 days.

(21) Appl. No.: 09/838,013

(22) Filed: Apr. 19, 2001

(51) Int. Cl.$^7$ .............................................. G03K 7/22
(52) U.S. Cl. ..................................................... 430/30
(58) Field of Search ..................... 430/30, 396; 355/77; 438/14, 16

(56) References Cited

U.S. PATENT DOCUMENTS

| | | | |
|---|---|---|---|
| 5,867,276 A | 2/1999 | McNeil et al. | 356/445 |
| 5,877,276 A | 3/1999 | Borden | 356/376 |
| 5,880,838 A | 3/1999 | Marx et al. | 356/351 |
| 6,245,584 B1 * | 6/2001 | Marinaro et al. | 438/14 |

* cited by examiner

Primary Examiner—John A. McPherson
(74) Attorney, Agent, or Firm—Williams, Morgan & Amerson, P.C.

(57) ABSTRACT

A method of using scatterometric techniques to control stepper process is disclosed. In one illustrative embodiment, the method comprises providing a library of optical characteristic traces, each of which corresponds to a grating structure comprised of a plurality of photoresist features having a known profile, and forming at least one grating structure in a layer of photoresist, wherein the formed grating structure is comprised of a plurality of photoresist features having an unknown profile. The method further comprises illuminating the formed grating structure, measuring light reflected off of the formed grating structure to generate an optical characteristic trace for the formed grating structure, comparing the generated optical characteristic trace to at least one optical characteristic trace from the library, and modifying at least one parameter of a stepper exposure process to be performed on at least one subsequently processed wafer based upon the comparison of the generated optical characteristic trace and the optical characteristic trace from the library. In another embodiment, the generated optical characteristic trace for the grating structure is compared to a target optical characteristic trace for the grating structure, and at least one parameter of an exposure process to be performed on a layer of photoresist formed on a subsequently processed wafer may be determined or modified based upon this comparison.

46 Claims, 3 Drawing Sheets

METHOD OF CONTROLLING STEPPER PROCESS PARAMETERS BASED UPON SCATTEROMETRIC MEASUREMENTS OF DICD FEATURES

BACKGROUND OF THE INVENTION

1. Field of the Invention

This invention relates generally to semiconductor fabrication technology, and, more particularly, to a method of controlling stepper process parameters based upon scatterometric measurements of photoresist features.

2. Description of the Related Art

There is a constant drive within the semiconductor industry to increase the operating speed of integrated circuit devices, e.g., microprocessors, memory devices, and the like. This drive is fueled by consumer demands for computers and electronic devices that operate at increasingly greater speeds. This demand for increased speed has resulted in a continual reduction in the size of semiconductor devices, e.g., transistors. That is, many components of a typical field effect transistor (FET), e.g., channel length, junction depths, gate insulation thickness, and the like, are reduced. For example, all other things being equal, the smaller the channel length of the transistor, the faster the transistor will operate. Thus, there is a constant drive to reduce the size, or scale, of the components of a typical transistor to increase the overall speed of the transistor, as well as integrated circuit devices incorporating such transistors.

By way of background, an illustrative field effect transistor 10, as shown in FIG. 1, may be formed above a surface 15 of a semiconducting substrate or wafer 11 comprised of doped-silicon. The substrate 11 may be doped with either N-type or P-type dopant materials. The transistor 10 may have a doped polycrystalline silicon (polysilicon) gate electrode 14 formed above a gate insulation layer 16. The gate electrode 14 and the gate insulation layer 16 may be separated from doped source/drain regions 22 of the transistor 10 by a dielectric sidewall spacer 20. The source/drain regions 22 for the transistor 10 may be formed by performing one or more ion implantation processes to introduce dopant atoms, e.g., arsenic or phosphorous for NMOS devices, boron for PMOS devices, into the substrate 11. Shallow trench isolation regions 18 may be provided to isolate the transistor 10 electrically from neighboring semiconductor devices, such as other transistors (not shown).

The gate electrode 14 has a critical dimension 12, i.e., the width of the gate electrode 14, that approximately corresponds to the channel length 13 of the device when the transistor 10 is operational. Of course, the critical dimension 12 of the gate electrode 14 is but one example of a feature that must be formed very accurately in modern semiconductor manufacturing operations. Other examples include, but are not limited to, conductive lines, openings in insulating layers to allow subsequent formation of a conductive interconnection, i.e., a conductive line or contact, therein, etc.

In the process of forming integrated circuit devices, millions of transistors, such as the illustrative transistor 10 depicted in FIG. 1, are formed above a semiconducting substrate. In general, semiconductor manufacturing operations involve, among other things, the formation of layers of various materials, e.g., polysilicon, insulating materials, etc., and the selective removal of portions of those layers by performing known photolithographic and etching techniques. These processes are continued until such time as the integrated circuit device is complete. Additionally, although not depicted in FIG. 1, a typical integrated circuit device is comprised of a plurality of conductive interconnections, such as conductive lines and conductive contacts or vias, positioned in multiple layers of insulating material formed above the substrate. These conductive interconnections allow electrical signals to propagate between the transistors formed above the substrate.

During the course of fabricating such integrated circuit devices, a variety of features, e.g., gate electrodes, conductive lines, openings in layers of insulating material, etc., are formed to very precisely controlled dimensions. Such dimensions are sometimes referred to as the critical dimension (CD) of the feature. It is very important in modern semiconductor processing that features be formed as accurately as possible due to the reduced size of those features in such modem devices. For example, gate electrodes may now be patterned to a width 12 that is approximately 0.2 $\mu$m (2000 Å), and further reductions are planned in the future. As stated previously, the width 12 of the gate electrode 14 corresponds approximately to the channel length 13 of the transistor 10 when it is operational. Thus, even slight variations in the actual dimension of the feature as fabricated may adversely affect device performance. Thus, there is a great desire for a method that may be used to accurately, reliably and repeatedly form features to their desired critical dimension, i.e., to form the gate electrode 14 to its desired critical dimension 12.

Photolithography is a process typically employed in semiconductor manufacturing. Photolithography generally involves forming a patterned layer of photoresist above one or more layers of material that are desired to be patterned, and using the patterned photoresist layer as a mask in subsequent etching processes. In general, in photolithography operations, the pattern desired to be formed in the underlying layer or layers of material is initially formed on a reticle. Thereafter, using an appropriate stepper tool and known photolithographic techniques, the image on the reticle is transferred to the layer of photoresist. Then, the layer of photoresist is developed so as to leave in place a patterned layer of photoresist substantially corresponding to the pattern on the reticle. This patterned layer of photoresist is then used as a mask in subsequent etching processes, wet or dry, performed on the underlying layer or layers of material, e.g., a layer of polysilicon, metal or insulating material, to transfer the desired pattern to the underlying layer. The patterned layer of photoresist is comprised of a plurality of features, e.g., line-type features or opening-type features, that are to be replicated in an underlying process layer. The features in the patterned layer of photoresist also have a critical dimension, sometimes referred to as a develop inspect critical dimension (DICD).

After the patterned layer of photoresist features is formed, one or more etching processes may be performed to transfer the pattern in the layer of photoresist to the underlying process layer. For example, an initial photoresist etching process may be performed to further reduce the size of the photoresist features. Thereafter, the underlying process layer may then be subjected to an anisotropic etching process using the patterned layer of photoresist comprised of the reduced size photoresist features as a mask.

However, there are many variations in semiconductor manufacturing operations that tend to make it difficult to obtain consistent results in manufacturing features of semiconductor devices having very small critical dimensions. For example, there may be variations in the thickness of the layer of photoresist, the underlying process layers may be more or less reflective than anticipated, anti-reflective coating layers, if used, may be less effective than would otherwise be desired. Such variations may exist within a given lot of wafers (within run) or in different lots of wafers (lot-to-lot variations). As a result, it is desirable to have a control methodology that assists in producing features of integrated circuit devices in a consistent, reliable and repeatable manner even in view of variations in manufacturing operations, such as those described above.

The present invention is directed to a method and system that may solve, or at least reduce, some or all of the aforementioned problems.

SUMMARY OF THE INVENTION

The present invention is generally directed to a method of using scatterometry measurements to control stepper process parameters. In one illustrative embodiment, the method comprises providing a library of optical characteristic traces, each of which corresponds to a grating structure comprised of a plurality of photoresist features having a known profile, forming at least one grating structure in a layer of photoresist, wherein the formed grating structure is comprised of a plurality of photoresist features having an unknown profile, and illuminating the formed grating structure. The method further comprises measuring light reflected off of the formed grating structure to generate an optical characteristic trace for the formed grating structure, comparing the generated optical characteristic trace to at least one optical characteristic trace from the library, and modifying at least one parameter of a stepper exposure process to be performed on at least one subsequently processed wafer based upon the comparison of the generated optical characteristic trace and the at least one optical characteristic trace from the library.

In another illustrative embodiment, the method comprises providing a wafer having at least one process layer and a layer of photoresist formed thereabove, forming at least one grating structure in the layer of photoresist, illuminating the grating structure, and measuring light reflected off of the grating structure to generate an optical characteristic trace for the grating structures. The method further comprises comparing the generated optical characteristic trace to a target optical characteristic trace, and determining, based upon a comparison of the generated optical characteristic trace and the target optical characteristic trace, at least one parameter of an exposure process to be performed on a layer of photoresist formed on a subsequently processed wafer. In yet another embodiment, the invention comprises modifying at least one parameter of a stepper exposure process to be performed on a subsequently processed wafer based upon a deviation between the generated optical characteristic trace and the target optical characteristic trace.

BRIEF DESCRIPTION OF THE DRAWINGS

The invention may be understood by reference to the following description taken in conjunction with the accompanying drawings, in which like reference numerals identify like elements, and in which.

Figure 1:
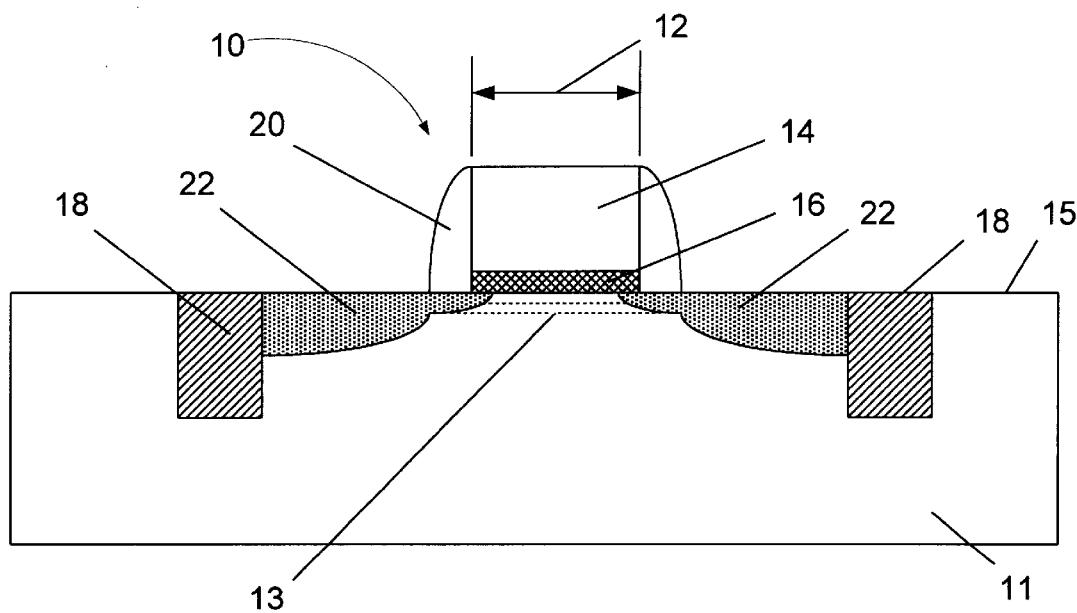
FIG. 1 is a cross-sectional view of an illustrative prior art transistor.

While the invention is susceptible to various modifications and alternative forms, specific embodiments thereof have been shown by way of example in the drawings and are herein described in detail. It should be understood, however, that the description herein of specific embodiments is not intended to limit the invention to the particular forms disclosed, but on the contrary, the intention is to cover all modifications, equivalents, and alternatives falling within the spirit and scope of the invention as defined by the appended claims.

DETAILED DESCRIPTION OF THE INVENTION

Illustrative embodiments of the invention are described below. In the interest of clarity, not all features of an actual implementation are described in this specification. It will of course be appreciated that in the development of any such actual embodiment, numerous implementation-specific decisions must be made to achieve the developers' specific goals, such as compliance with system-related and business-related constraints, which will vary from one implementation to another. Moreover, it will be appreciated that such a development effort might be complex and time-consuming, but would nevertheless be a routine undertaking for those of ordinary skill in the art having the benefit of this disclosure.

The present invention will now be described with reference to the attached figures. Although the various regions and structures of a semiconductor device are depicted in the drawings as having very precise, sharp configurations and profiles, those skilled in the art recognize that, in reality, these regions and structures are not as precise as indicated in the drawings. Additionally, the relative sizes of the various features and doped regions depicted in the drawings may be exaggerated or reduced as compared to the size of those features or regions on fabricated devices. Nevertheless, the attached drawings are included to describe and explain illustrative examples of the present invention.

In general, the present invention is directed to a method of controlling stepper process parameters based upon scatterometric measurements of photoresist features. As will be readily apparent to those skilled in the art upon a complete reading of the present application, the present method is applicable to a variety of technologies, e.g., NMOS, PMOS, CMOS, etc., and it is readily applicable to a variety of devices, including, but not limited to, logic devices, memory devices, etc.

Semiconductor manufacturing generally involves multiple processes whereby multiple layers of material are formed above a semiconducting substrate, and portions of those layers are selectively removed until such time as a completed device is formed. In general, photolithography involves the process of forming a layer of photoresist material above one or more process layers in which a feature, e.g., a metal line, a gate electrode, an opening in a layer of insulating material, will be formed. Thereafter, a pattern that is desired to be transferred into the underlying process layer or layers will be formed in the layer of photoresist material. Then, using one or more etching processes, the underlying process layer is etched using the patterned layer of photoresist as a mask, thereby resulting in a patterned process layer that replicates the pattern formed in the layer of photoresist.

More particularly, the photolithography process generally involves the steps of: (1) applying a layer of photoresist above a wafer, typically accomplished by a spin-coating process; (2) pre-baking (or soft-baking) the layer of photoresist at a temperature of approximately 90–120° C. to reduce the level of solvents in the layer of photoresist and to improve the adhesion characteristics of the photoresist, (3) performing an exposure process, wherein a pattern is projected onto the layer of photoresist through a reticle used in a stepper tool to create a latent image in the layer of photoresist; (4) performing a post-exposure bake on the layer of photoresist at a temperature approximately 5–15° C. higher than the pre-bake process; (5) performing a develop process to turn the latent image in the layer of photoresist into the final resist image; and (6) performing a post-bake process (or hard-bake) at a temperature of approximately 125–160° C. to remove residual solids, improve adhesion, and to increase the etch resistance of the photoresist. These process steps are well known to those skilled in the art and, thus, will not be described herein in any greater detail.

Figure 2:
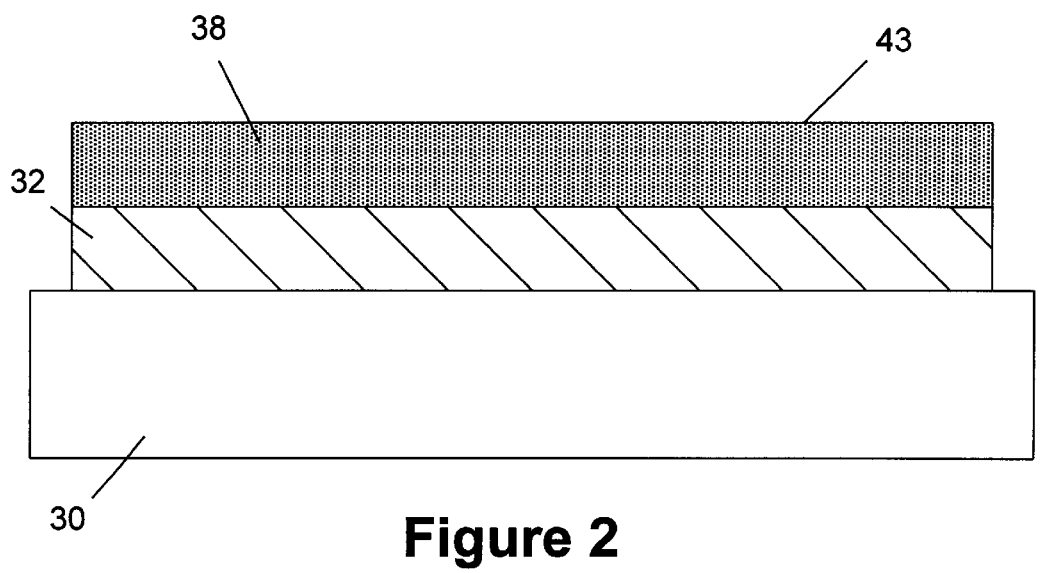
FIG. 2 is a cross-sectional view depicting an illustrative wafer having a process layer and a layer of photoresist formed thereabove.

FIG. 2 depicts an illustrative wafer or substrate 30 having a process layer 32 formed thereabove. The process layer 32 is meant to be representative in nature of any of a variety of types of process layers wherein various features may be formed. For example, the process layer 32 may be comprised of a layer of polysilicon, a metal, e.g., aluminum, an insulating material, e.g., silicon dioxide, silicon oxynitride, etc. The process layer 32 may be formed by a variety of processes, e.g., chemical vapor deposition ("CVD"), plasma enhanced chemical vapor deposition ("PECVD"), physical vapor deposition ("PVD"), low pressure chemical vapor deposition ("LPCVD"), thermal growing processes, etc., and its thickness may vary.

Also depicted in FIG. 2 is a layer of photoresist 38, having a surface 43. The layer of photoresist 38 may be comprised of either a positive or negative type photoresist material, and it may be formed by a variety of spin-coating processes commonly found in modern semiconductor manufacturing facilities. Thereafter, as shown in FIG. 3, the layer of photoresist 38 is patterned using known photolithographic and development techniques, such as those described earlier in this application, to define a plurality of photoresist features 38A.

Figure 3:
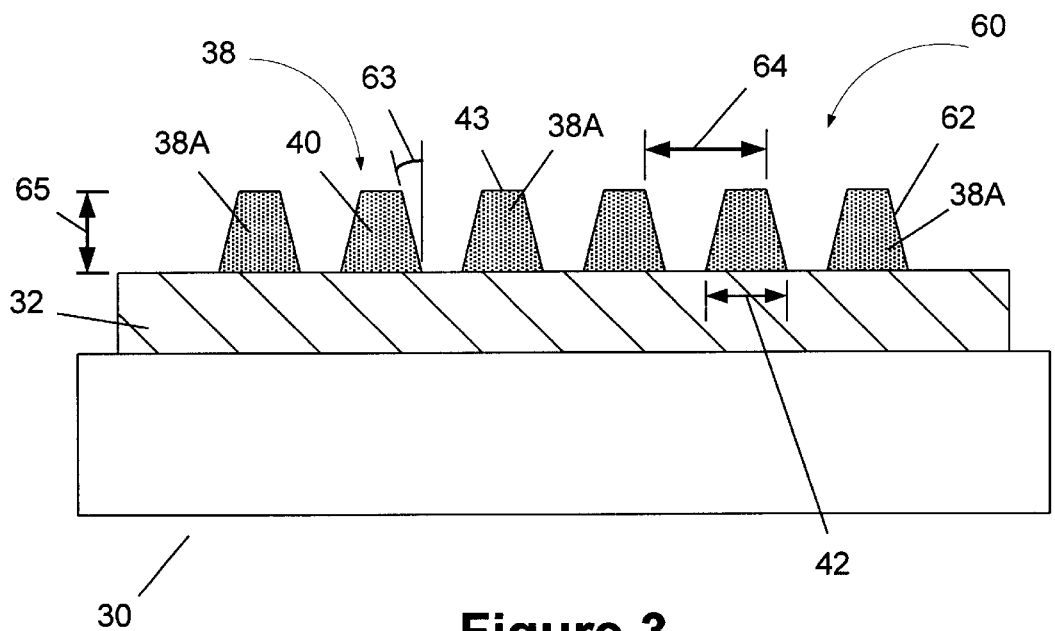
FIG. 3 is a cross-sectional view of the wafer of FIG. 2 after the layer of photoresist has been patterned.
Figure 4:
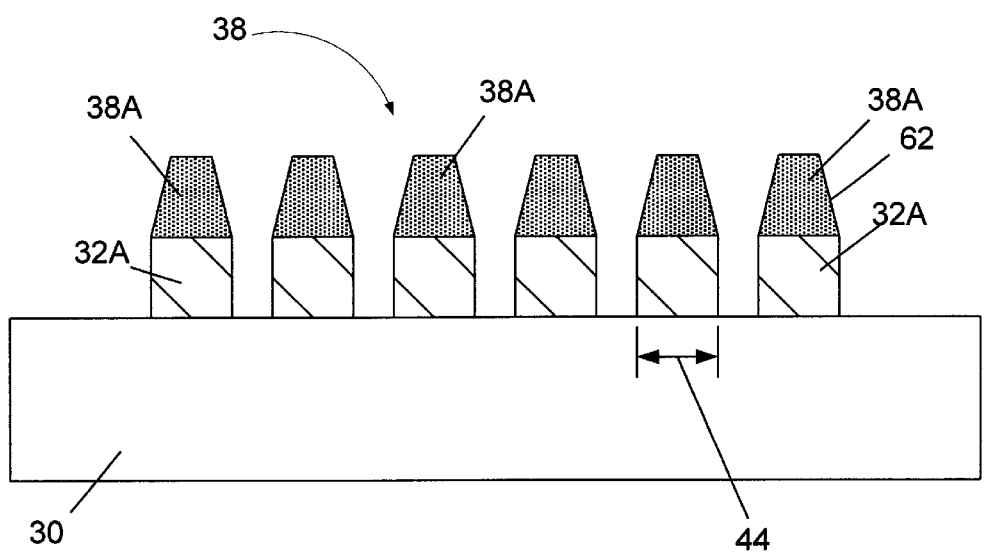
FIG. 4 is a cross-sectional view of the wafer of FIG. 3 after an etching process has been performed on the underlying process layer.

Ultimately, the layer of photoresist 38 (as shown in FIG. 3) will be used as a mask during one or more etching processes used to form a plurality of features in the underlying process layer 32. The present invention is intended to be applicable to the formation of any of the types of features formed in modern semiconductor manufacturing. For example, such features may be gate electrode structures, conductive lines or plugs, openings in insulating layers, etc. For purposes of illustration only, the present invention will be discussed in the context wherein the process layer 32 is a layer of polysilicon, and a plurality of gate electrode structures 32A (see FIG. 4) will be formed therein. However, as will be understood by those skilled in the art after a complete reading of the present application, the present invention should not be considered as limited to the exemplary embodiment discussed herein.

As shown in FIG. 3, the photoresist features 38A have a critical dimension 42, a so-called develop-inspect critical dimension (DICD). In general, the present invention is directed to using scatterometric techniques to measure a grating structure comprised of a plurality of photoresist features 38A, and, based upon those scatterometric measurements, controlling one or more parameters of the stepper exposure process, e.g., stepper dose, to drive the DICD dimension 42 of the photoresist features 38A to a desired target value that will be useful in producing gate electrode structures 32A having the desired critical dimension 44 (see FIGS. 3 and 4) after etching, a so-called Final Inspect Critical Dimension ("FICD") in compliance with design requirements. Please note that the gate electrode structures 32A are depicted as essentially rectangular blocks of material. In actual devices, the sidewalls of the gate electrode structures 38A may be slightly tapered.

As set forth above, a plurality of photoresist features 38A will define a grating structure 60 (see FIGS. 3 and 5) that will be measured using scatterometry techniques. One or more of the grating structures 60 may be formed above a wafer. As will be recognized by those skilled in the art after a complete reading of the present application, the number, size, shape, location and configuration of the grating structures 60 formed in the layer of photoresist 38 may be varied as a matter of design choice. For example, three, five or nine grating structures 60 may be formed in the layer of photoresist 38 at various locations across the surface of the wafer 30. Moreover, the grating structures 60 may be formed in the scribe lines of the wafer or above the area occupied by the production die formed on the wafer.

Figure 5:
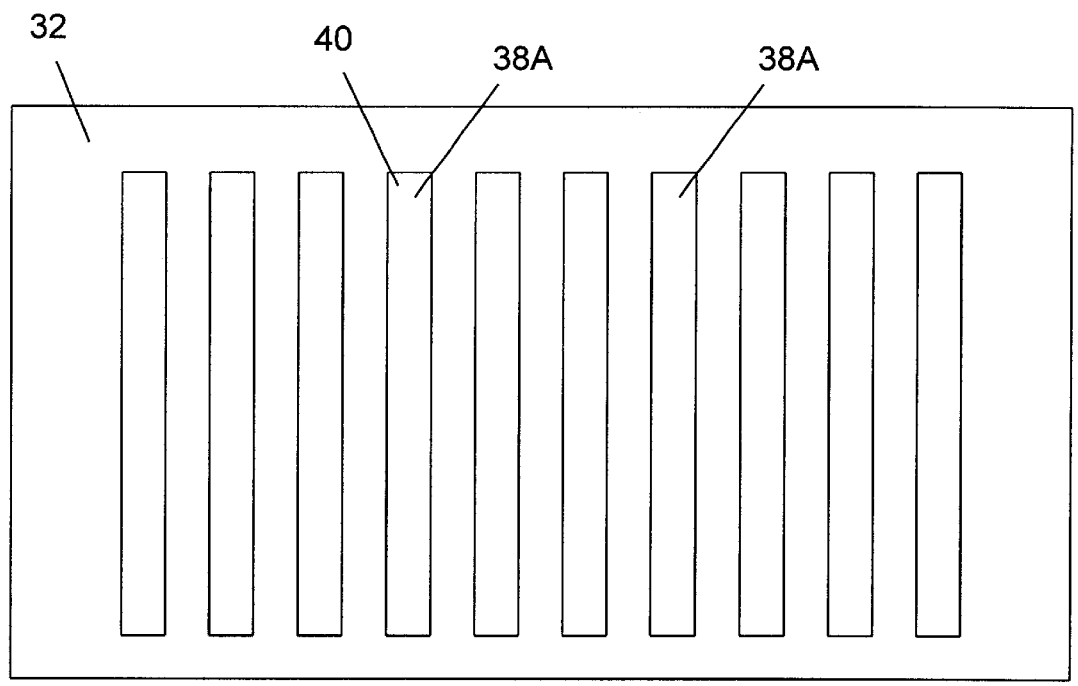
FIG. 5 is a plan view of one illustrative embodiment of a grating structure that may be employed with the present invention.

One such illustrative grating structure 60 is depicted in FIGS. 3 and 5, wherein the photoresist features 38A define a plurality of lines 40 formed in the layer of photoresist 38. The photoresist features 38A comprising the grating structure 60 have a thickness 65 and sidewalls 62 disposed at an angle 63 (relative to a line normal to the surface 43 of the layer of photoresist 38). The thickness 65, the sidewall angle 63, and spacing or pitch 64 between the photoresist features 38A may be varied as a matter of design choice. For example, the grating structure 60 may be formed in regions having approximate dimensions of 100 $\mu$m×120 $\mu$m, and it may be comprised of approximately 300–400 lines 40 (depending upon the selected pitch). Normally, the thickness 65 of the lines 40 will correspond to the thickness of the layer of photoresist 38. The sidewall angle 63 of the lines 40 may vary from approximately 80–100 degrees relative to the surface 43 of the layer of photoresist 38.

Figure 6:
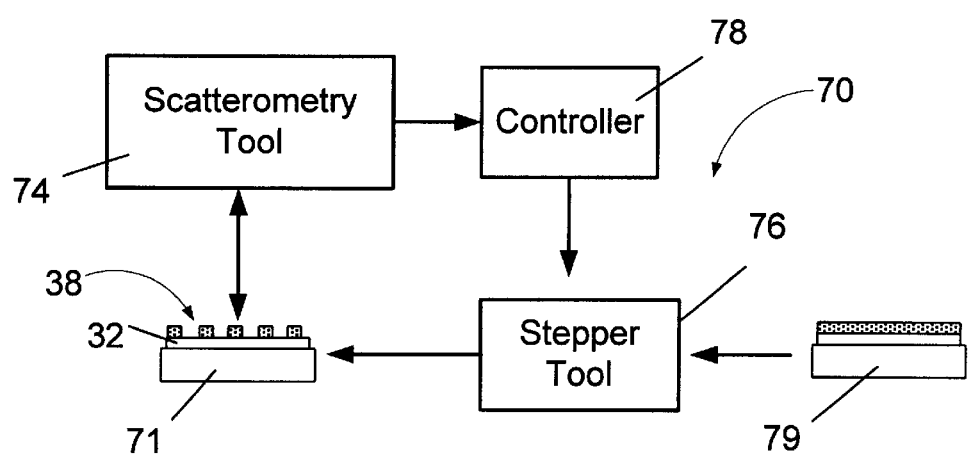
FIG. 6 depicts an illustrative embodiment of a system in accordance with one embodiment of the present invention.

An illustrative system 70 that may be used in one embodiment of the present invention is shown in FIG. 6. The system 70 is comprised of a scatterometry tool 74, a stepper tool 76, and a controller 78. As indicated in FIG. 6, the wafer 71 is representative of one or more wafers comprised of at least one process layer 32 and a patterned layer of photoresist 38 formed thereabove, that have previously been processed in the stepper tool 76. The layer of photoresist 38 on the wafer 71 was subjected to an exposure process in the stepper tool 76 to transfer the features defined in the reticle (not shown) to the layer of photoresist 38. During this process, the grating structures 60 were defined in the layer of photoresist 38, as were many other features that will be used to ultimately form corresponding features in the underlying process layer 32. Thereafter, a post-exposure bake process may be performed on the layer of photoresist 38. Ultimately, the layer of photoresist 38 will be subjected to a development process whereby soluble portions of the layer of photoresist 38 will be removed. The patterned layer of photoresist 38 reflects the pattern in the reticle used during the exposure process. This patterned layer of photoresist 38 will be used in patterning the underlying process layer 32 by performing one or more known etching processes. The layer of photoresist 38 may be formed in the "track" portion of a typical photolithography module by performing a spin-coating process. Prior to being subjected to an exposure process in the stepper tool 76, the layer of photoresist 38 will normally be subjected to a soft-bake process to drive off excessive solvents in the layer of photoresist 38.

A variety of scatterometry tools 74 may be used with the present invention, e.g., so-called 2θ-type systems and lens-type scatterometry tools. The scatterometry tool 74 may use white light, or some other wavelength or combination of wavelengths, depending on the specific implementation. Typically, the scatterometry tool 74 will generate an incident beam that has a wide spectral composition and wherein the intensity of the light changes slowly in comparison to changes in wavelength. The angle of incidence of the light may also vary, depending on the specific implementation. The profile traces generated by the scatterometry tool 74 may be based upon a comparison of light intensity to wavelength (for white light, fixed angle type scatterometry tools) or a comparison of intensity to incident angle (for angle resolved systems that use a single light source). For example, a spectroscopic ellipsometer (single angle, many wavelengths), or a laser (single wavelength, many angles) may be used with the present invention. Additionally, the light source and the detector may be arranged in a concentric circle configuration, with the light source illuminating the grating structure 60 from a perpendicular orientation, e.g., a reflectometer. The intensity of the reflected light may be measured as s- and p-polarization over either multiple angles or at multiple wavelengths.

In general, the scatterometry tool 74 (see FIG. 6) includes optical hardware, such as an ellipsometer or reflectometer, and a data processing unit loaded with a scatterometry software application for processing data collected by the optical hardware. For example, the optical hardware may include a Model OP5230 or OP5240 with a spectroscopic ellipsometer offered by Thermawave, Inc. of Fremont, Calif. The data processing unit may comprise a profile application server manufactured by Timbre Technologies, a fully owned subsidiary of Tokyo Electron America, Inc. of Austin, Tex. and distributed by Thermawave, Inc.

As a result of a variety of factors, the features 38A in the layer of photoresist 38 that comprise the grating structure 60 will have varying characteristics or profiles, e.g., critical dimensions will be wider than anticipated, comers of features will be rounded, etc. The changes in the characteristics or profile of the photoresist features 38A of the grating structure 60 will cause a significant change in the optical characteristic trace for the grating structure 60. Thus, using Maxwell's equations, a unique optical characteristic trace may be calculated for each anticipated variation in the profile of the photoresist features 38A that comprise the grating structure 60. A library may be created for the optical characteristic traces corresponding to each such variation. Scatterometry libraries are commercially available from Timbre Technologies, Inc. The calculated optical characteristic traces for the grating structure 60 may be correlated to any desired aspect of the features 38A comprising the grating structure 60, e.g., the thickness 65 of the lines 40, the sidewall angle 63, etc., that may reflect the final profile of the photoresist features 38A, e.g., lines or trenches, comprising the grating structure 60.

The present invention may be employed to compare or match a measured or generated optical characteristic trace for a grating structure 60 formed in a layer of photoresist 38 to the library of such optical characteristic traces, each of which corresponds to a particular anticipated variation of the photoresist features 38A comprising the grating structure 60. That is, in this embodiment, the present invention involves using a scatterometry tool 74 to measure or generate an optical characteristic trace for one or more grating structures 60 formed in the layer of photoresist 38. Thereafter, the scatterometry tool 74 (or another controller somewhere within the manufacturing operation, e.g., controller 78) then compares or matches the measured optical characteristic trace to one of the traces stored in the library. As a result of this match, the scatterometry tool 74 (or other controller) may provide output data indicating a variety of characteristics of the features comprising the grating structure 60. For example, the scatterometry tool 74 may provide output data indicating the angle of the sidewalls 63 of the photoresist features 38A, or the critical dimension (DICD) of such features 38A.

By taking measurements of each of the grating structures 60, the present invention may be used to determine if the exposure process is producing features 38A in the layer of photoresist 38 that are unacceptable, e.g., producing photoresist features with larger than desired critical dimensions. Moreover, based upon the optical characteristic of the grating structures 60, the exposure process to be performed by the stepper tool on subsequently process wafers may be controlled or modified so as to produce photoresist features 38A having acceptable DICD dimensions and profiles.

Based upon a comparison of the measured or generated optical characteristic trace for a grating structure 60 formed in the layer of photoresist and an optical characteristic trace from the library, the controller 78 may determine or modify one or more parameters of an exposure process to be performed in the stepper tool 76 on a subsequently processed wafer. For example, the matching of the measured optical characteristic trace with one of the traces from the library may lead to the conclusion that the photoresist features 38A comprising the grating structure 60 have a critical dimension (DICD) greater than desired, or greater than a target value, then the stepper exposure dose on a subsequently processed wafer, either in the same lot or in a subsequent lot, may be increased. Conversely, if the DICD measurements of the photoresist features 38A are smaller than anticipated, the stepper exposure dose may be decreased, to thereby increase the critical dimension of subsequently formed photoresist features. Other parameters that may be controlled include the location of the focal plane of the stepper exposure process relative to the layer of photoresist and substrate. In short, the controller 78 may analyze the scatterometry metrology data to determine how well the exposure process is performing in terms of producing photoresist features 38A having desired DICD measurements and profiles. Moreover, if necessary, the controller 78 may modify one or more parameters of the exposure process, e.g., exposure dose, tilt, positioning of the wafer relative to a focal plane of the exposure process, etc., to compensate for the unacceptable variations in the photoresist features 38A.

In another embodiment, the present invention may be used to compare a measured optical characteristic trace of a grating structure 60 formed in the layer of photoresist 38 to a target optical characteristic trace. The target trace may be calculated (using Maxwell's equations) for a grating structure 60 that corresponds to the production of photoresist features 38A with acceptable DICD measurements and profiles. This target optical characteristic trace may be stored in the aforementioned library along with one or more additional traces, such as those described above. Based upon a comparison of the measured trace and the target trace, a relatively rough approximation of the quality of the process performed may be determined. That is, by comparing the measured trace to the target trace, it may be determined if the process is producing photoresist features 38A having a profile sufficiently close to the ideal or acceptable profile such that further matching of the measured trace with an additional trace from the library is unwarranted. Using this technique, an initial determination may be made as to the acceptability of the process. Of course, this step may be performed in addition to the matching or correlating of a measured trace to a trace from the library as described above.

Moreover, based upon a comparison of the measured optical characteristic trace for the grating structure 60 and the target optical characteristic trace, the controller 78 may modify one or more parameters of the stepper exposure process on subsequently processed wafers 11. For example, if a comparison of the measured or generated trace with the target trace indicates that there is little or no deviation from the target optical characteristic trace for each of the structures 60, the controller 78 may then determine (or confirm) that the same exposure process may be performed on subsequently processed wafers, either in the same lot or in a different lot. Alternatively, if the analysis indicates that there is a deviation between the target optical characteristic traces for the grating structures 60 and the measured optical characteristic traces for the grating structures 60, the controller 78 may then analyze the metrology data and modify one or more parameters of the exposure process, e.g., exposure dose, tilt, location of the focal plane, to compensate for the variation indicated by the optical metrology.

The optical measurements of the grating structures 60 may be performed on any desired number of wafers. For example, such measurements may be performed on all exposure fields 41 on all wafers in one or more lots, or on a representative number of wafers in a given lot, and these results may then be used to determine or vary one or more parameters, e.g., exposure dose, location of the focal plane, tilt, etc., of the exposure process performed in the stepper tool 76 on subsequently processed wafers. Moreover, the measurements of the gratings 60 may be made after the layer of photoresist 38 has been subjected to a post-exposure bake process, i.e., after the latent image has been formed, or after it has been fully developed.

Control equations may be employed to adjust the operating recipe of the stepper tool 76 in situations where the methods described herein indicate that an adjustment is warranted. The control equations may be developed empirically using commonly known linear or nonlinear techniques. The controller 78 may automatically control the operating recipes of the stepper tool 76 used to perform an exposure process on the subsequently processed wafers. Through use of the present invention, the extent and magnitude of variations in targeted DICD dimensions of photoresist features 38A in a patterned layer of photoresist may be reduced.

In the illustrated embodiments, the controller 78 is a computer programmed with software to implement the functions described herein. Moreover, the functions described for the controller 78 may be performed by one or more controllers spread through the system. For example, the controller 78 may be a fab level controller that is used to control processing operations throughout all or a portion of a semiconductor manufacturing facility. Alternatively, the controller 78 may be a lower level computer that controls only portions or cells of the manufacturing facility. Moreover, the controller 78 may be a stand-alone device, or it may reside on the stepper tool 76 or on a photolithography module (not shown). However, as will be appreciated by those of ordinary skill in the art, a hardware controller (not shown) designed to implement the particular functions may also be used.

Portions of the invention and corresponding detailed description are presented in terms of software, or algorithms and symbolic representations of operations on data bits within a computer memory. These descriptions and representations are the ones by which those of ordinary skill in the art effectively convey the substance of their work to others of ordinary skill in the art. An algorithm, as the term is used here, and as it is used generally, is conceived to be a self-consistent sequence of steps leading to a desired result. The steps are those requiring physical manipulations of physical quantities. Usually, though not necessarily, these quantities take the form of optical, electrical, or magnetic signals capable of being stored, transferred, combined, compared, and otherwise manipulated. It has proven convenient at times, principally for reasons of common usage, to refer to these signals as bits, values, elements, symbols, characters, terms, numbers, or the like.

It should be understood, however, that all of these and similar terms are to be associated with the appropriate physical quantities and are merely convenient labels applied to these quantities. Unless specifically stated otherwise, or as is apparent from the discussion, terms such as "processing" or "computing" or "calculating" or "determining" or "displaying" or the like, refer to the actions and processes of a computer system, or similar electronic computing device, that manipulates and transforms data represented as physical, electronic quantities within the computer system's registers and memories into other data similarly represented as physical quantities within the computer system memories or registers or other such information storage, transmission or display devices.

An exemplary software system capable of being adapted to perform the functions of the controller 78, as described, is the Catalyst system offered by KLA Tencor, Inc. The Catalyst system uses Semiconductor Equipment and Materials International (SEMI) Computer Integrated Manufacturing (CIM) Framework compliant system technologies, and is based on the Advanced Process Control (APC) Framework. CIM (SEMI E81-0699—Provisional Specification for CIM Framework Domain Architecture) and APC (SEMI E93-0999—Provisional Specification for CIM Framework Advanced Process Control Component) specifications are publicly available from SEMI.

The present invention is generally directed to a method of using scatterometry measurements of photoresist features to control stepper process parameters. In one illustrative embodiment, the method comprises providing a library of optical characteristic traces, each of which corresponds to a grating structure 60 comprised of a plurality of photoresist features 38A having a known profile, forming at least one grating structure 60 in a layer of photoresist 38, wherein the grating structure 60 is comprised of a plurality of features 38A having an unknown profile, and illuminating the formed grating structure 60. The method further comprises measuring light reflected off of the formed grating structure 60 to generate an optical characteristic trace for the grating structure 60, comparing the generated optical characteristic trace to at least one optical characteristic trace from the library, and modifying at least one parameter of a stepper exposure process to be performed on at least one subsequently processed wafer based upon the comparison of the generated optical characteristic trace and the optical characteristic trace from the library.

In another illustrative embodiment, the method comprises providing a wafer 11 having at least one process layer 36 and a layer of photoresist 38 formed thereabove, forming at least one grating structure 60 in the layer of photoresist 38, illuminating the formed grating structure 60, and measuring light reflected off of the formed grating structure 60 to generate an optical characteristic trace for the formed grating structure 60. The method further comprises comparing the generated optical characteristic trace to a target optical characteristic trace, and determining, based upon a comparison of the generated optical characteristic trace and the target optical characteristic trace, at least one parameter of an exposure process to be performed on a layer of photoresist 38 formed on a subsequently processed wafer. In yet another embodiment, the invention comprises modifying at least one parameter of a stepper exposure process to be performed on a subsequently processed wafer based upon a deviation between the generated optical characteristic trace and the target optical characteristic trace.

Through use of the present invention, better process control may be achieved in modern integrated circuit manufacturing facilities. Additionally, the present invention may enable more precise formation of various features of integrated circuit devices, thereby improving device performance and increasing production yields.

The particular embodiments disclosed above are illustrative only, as the invention may be modified and practiced in different but equivalent manners apparent to those skilled in the art having the benefit of the teachings herein. For example, the process steps set forth above may be performed in a different order. Furthermore, no limitations are intended to the details of construction or design herein shown, other than as described in the claims below. It is therefore evident that the particular embodiments disclosed above may be altered or modified and all such variations are considered within the scope and spirit of the invention. Accordingly, the protection sought herein is as set forth in the claims below.

What is claimed:

1. A method, comprising:
    providing a library of optical characteristic traces, each of which corresponds to a grating structure comprised of a plurality of photoresist features having a known profile;
    forming at least one grating structure in a layer of photoresist, said formed grating structure being comprised of a plurality of photoresist features having an unknown profile;
    illuminating said formed grating structure;
    measuring light reflected off of said formed grating structure to generate an optical characteristic trace for said formed grating structure;
    comparing said generated optical characteristic trace to at least one optical characteristic trace from said library; and
    modifying at least one parameter of a stepper exposure process to be performed on at least one subsequently processed wafer based upon said comparison of said generated optical characteristic trace and said at least one optical characteristic trace from said library.

2. The method of claim 1, wherein forming at least one grating structure in a layer of photoresist comprises forming a plurality of grating structures in a layer of photoresist.

3. The method of claim 1, wherein modifying at least one parameter of a stepper exposure process to be performed on at least one subsequently processed wafer comprises modifying at least one of a focal plane position, a tilt angle of a reticle, and a tilt angle of a wafer for at least one subsequently processed wafer.

4. The method of claim 1, wherein said formed grating structure is comprised of a plurality of line photoresist features.

5. The method of claim 1, wherein measuring light reflected off of said grating structure to generate an optical characteristic trace for said grating structure is performed after said layer of photoresist is subjected to a development process.

6. The method of claim 1, wherein comparing said generated optical characteristic trace to at least one optical characteristic trace from said library comprises comparing said generated optical characteristic trace to at least one optical characteristic trace from said library to determine at least one aspect of a profile of said plurality of photoresist features that comprise said formed grating structure.

7. A method, comprising:
    providing a library of optical characteristic traces, each of which corresponds to a grating structure comprised of a plurality of photoresist features having a known profile;
    forming a plurality of grating structures in a layer of photoresist, each of said formed grating structures being comprised of a plurality of photoresist features having an unknown profile;
    illuminating each of said formed grating structures;
    measuring light reflected off of each of said plurality of formed grating structures to generate an optical characteristic trace for each of said plurality of formed grating structures;
    comparing each of said generated optical characteristic traces to at least one optical characteristic trace from said library; and
    modifying at least one parameter of a stepper exposure process to be performed on at least one subsequently processed wafer based upon said comparison of said generated optical characteristic traces and said at least one optical characteristic trace from said library.

8. The method of claim 7, wherein forming a plurality of grating structures in a layer of photoresist comprises forming at least three grating structures in a layer of photoresist.

9. The method of claim 7, wherein forming a plurality of grating structures in a layer of photoresist comprises forming at least five grating structures in a layer of photoresist.

10. The method of claim 7, wherein modifying at least one parameter of a stepper exposure process to be performed on at least one subsequently processed wafer comprises modifying at least one of a focal plane position, tilt angle of a reticle, and tilt angle of a wafer for at least one subsequently processed wafer.

11. The method of claim 7, wherein said formed grating structures are comprised of a plurality of line photoresist features.

12. The method of claim 7, wherein measuring light reflected off of said plurality of grating structures to generate an optical characteristic trace for each of said grating structures is performed after said layer of photoresist is subjected to a development process.

13. The method of claim 7, wherein comparing each of said generated optical characteristic traces to at least one optical characteristic trace from said library comprises comparing each of said generated optical characteristic traces to at least one optical characteristic trace from said library to determine at least one aspect of a profile of said photoresist features that comprise said formed grating structure.

14. A method, comprising:
provide a wafer having at least one process layer and a layer of photoresist formed thereabove;
forming at least one grating structure in said layer of photoresist;
illuminating said formed grating structure;
measuring light reflected off of said formed grating structure to generate an optical characteristic trace for said formed grating structure;
comparing the generated optical characteristic trace for said formed grating structure to a target optical characteristic trace; and
determining, based upon a comparison of said generated optical characteristic trace and said target optical characteristic trace, at least one parameter of an exposure process to be performed on a layer of photoresist formed above a subsequently processed wafer.

15. The method of claim 14, wherein providing a wafer having at least one process layer and a layer of photoresist formed thereabove comprises providing a wafer having at least one process layer and a layer of photoresist formed thereabove, said layer of photoresist being comprised of a positive photoresist material.

16. The method of claim 14, wherein forming at least one grating structure in said layer of photoresist comprises forming a plurality of grating structures in said layer of photoresist.

17. The method of claim 14, wherein forming at least one grating structure in said layer of photoresist comprises forming at least three grating structures in said layer of photoresist.

18. The method of claim 14, wherein forming at least one grating structure in said layer of photoresist comprises forming at least five grating structures in said layer of photoresist.

19. The method of claim 14, wherein measuring light reflected off of said grating structure to generate an optical characteristic trace for said grating structure is performed after said layer of photoresist is subjected to a development process.

20. The method of claim 14, further comprising modifying, based upon a comparison of said generated optical characteristic trace and said target optical characteristic trace, at least one parameter of an exposure process to be performed on a layer of photoresist formed on a subsequently processed wafer.

21. The method of claim 14, wherein said at least one parameter of said exposure process is comprised of at least one of an exposure dose, a location of a focal plane position, a tilt angle of a reticle and a tilt angle of a wafer for at least one subsequently processed wafer.

22. The method of claim 14, wherein measuring the reflected light comprises measuring the intensity of the reflected light.

23. The method of claim 14, wherein comparing the generated optical characteristic trace for said formed grating structure to a target optical characteristic trace comprises comparing the generated optical characteristic trace for said formed grating structure to a target optical characteristic trace that is based upon at least one aspect of a profile of at least one feature in said layer of photoresist that comprises said formed grating structure.

24. A method, comprising:
providing a wafer having at least one process layer and a layer of photoresist formed thereabove;
forming a plurality of grating structures in said layer of photoresist;
illuminating each of said formed grating structures;
measuring light reflected off of said formed grating structures to generate an optical characteristic trace for each of said formed grating structures;
comparing the generated optical characteristic trace for each of said grating structures to a target optical characteristic trace; and
modifying, based upon a comparison of said generated optical characteristic traces and said target optical characteristic trace, at least one parameter of an exposure process to be performed on a layer of photoresist formed on a subsequently processed wafer.

25. The method of claim 24, wherein said layer of photoresist is comprised of a positive photoresist material.

26. The method of claim 24, wherein forming a plurality of photoresist features comprises forming at least three grating structures in said layer of photoresist.

27. The method of claim 24, wherein measuring light reflected off of said formed grating structures to generate an optical characteristic trace for each of said grating structures is performed after said layer of photoresist is subjected to a development process.

28. The method of claim 24, wherein said at least one parameter of said exposure process is comprised of at least one of a location of a focal plane position, a tilt angle of a reticle and a tilt angle of a wafer for at least one subsequently processed wafer.

29. The method of claim 24, wherein measuring the reflected light comprises measuring the intensity of the reflected light.

30. The method of claim 24, wherein comparing the generated optical characteristic trace for said formed grating structure to a target optical characteristic trace comprises comparing the generated optical characteristic trace for said formed grating structure to a target optical characteristic trace that is based upon at least one aspect of a profile of at least one feature in said layer of photoresist that comprises said formed grating structure.

31. A method, comprising:
providing a library of optical characteristic traces, each of which corresponds to a grating structure comprised of a plurality of photoresist features having a known profile;
forming at least one grating structure in a layer of photoresist, said formed grating structure being comprised of a plurality of photoresist features having an unknown profile;
illuminating said formed grating structure;
measuring light reflected off of said formed grating structure to generate an optical characteristic trace for said formed grating structure, said measurement being performed after said layer of photoresist has been subjected to a post-exposure bake process and prior to said layer of photoresist being subjected to a development process;
comparing said generated optical characteristic trace to at least one optical characteristic trace from said library; and
modifying at least one parameter of a stepper exposure process to be performed on at least one subsequently processed wafer based upon said comparison of said generated optical characteristic trace and said at least one optical characteristic trace from said library.

32. The method of claim 31, wherein comparing said generated optical characteristic trace to at least one optical characteristic trace from said library comprises comparing said generated optical characteristic trace to at least one optical characteristic trace from said library to determine at least one aspect of a profile of said plurality of photoresist features that comprise said formed grating structure.

33. A method, comprising:

providing a library of optical characteristic traces, each of which corresponds to a grating structure comprised of a plurality of photoresist features having a known profile;

forming a plurality of grating structures in a layer of photoresist, each of said formed grating structures being comprised of a plurality of photoresist features having an unknown profile;

illuminating each of said formed grating structures;

measuring light reflected off of each of said plurality of formed grating structures to generate an optical characteristic trace for each of said plurality of formed grating structures, said measurement being performed after said layer of photoresist has been subjected to a post-exposure bake process and prior to said layer of photoresist being subjected to a development process;

comparing each of said generated optical characteristic traces to at least one optical characteristic trace from said library; and modifying at least one parameter of a stepper exposure process to be performed on at least one subsequently processed wafer based upon said comparison of said generated optical characteristic traces and said at least one optical characteristic trace from said library.

34. The method of claim 33, wherein comparing each of said generated optical characteristic traces to at least one optical characteristic trace from said library comprises comparing each of said generated optical characteristic traces to at least one optical characteristic trace from said library to determine at least one aspect of a profile of said photoresist features that comprise said formed grating structure.

35. A method, comprising:

providing a wafer having at least one process layer and a layer of photoresist formed thereabove;

forming at least one grating structure in said layer of photoresist;

illuminating said formed grating structure;

measuring light reflected off of said formed grating structure to generate an optical characteristic trace for said formed grating structure, said measurement being performed after said layer of photoresist has been subjected to a post-exposure bake process and prior to said layer of photoresist being subjected to a development process;

comparing the generated optical characteristic trace for said formed grating structure to a target optical characteristic trace; and determining, based upon a comparison of said generated optical characteristic trace and said target optical characteristic trace, at least one parameter of an exposure process to be performed on a layer of photoresist formed above a subsequently processed wafer.

36. The method of claim 35, wherein comparing the generated optical characteristic trace for said formed grating structure to a target optical characteristic trace comprises comparing the generated optical characteristic trace for said formed grating structure to a target optical characteristic trace that is based upon at least one aspect of a profile of at least one feature in said layer of photoresist that comprises said formed grating structure.

37. A method, comprising:

providing a wafer having at least one process layer and a layer of photoresist formed thereabove;

forming a plurality of grating structures in said layer of photoresist;

illuminating each of said formed grating structures;

measuring light reflected off of said formed grating structures to generate an optical characteristic trace for each of said formed grating structures, said measurement being performed after said layer of photoresist has been subjected to a post-exposure bake process and prior to said layer of photoresist being subjected to a development process;

comparing the generated optical characteristic trace for each of said grating structures to a target optical characteristic trace; and modifying, based upon a comparison of said generated optical characteristic traces and said target optical characteristic trace, at least one parameter of an exposure process to be performed on a layer of photoresist formed on a subsequently processed wafer.

38. The method of claim 37, wherein comparing the generated optical characteristic trace for said formed grating structure to a target optical characteristic trace comprises comparing the generated optical characteristic trace for said formed grating structure to a target optical characteristic trace that is based upon at least one aspect of a profile of at least one feature in said layer of photoresist that comprises said formed grating structure.

39. A method, comprising:

forming at least one grating structure in a layer of photoresist, said formed grating structure being comprised of a plurality of photoresist features having an unknown profile;

illuminating said formed grating structure;

measuring light reflected off of said formed grating structure to generate an optical characteristic trace for said formed grating structure;

comparing said generated optical characteristic trace to at least one optical characteristic trace that corresponds to a grating structure comprised of a plurality of photoresist features having a known profile; and modifying at least one parameter of a stepper exposure process to be performed on at least one subsequently processed wafer based upon said comparison of said generated optical characteristic trace and said at least one optical characteristic trace.

40. The method of claim 39, wherein forming at least one grating structure in a layer of photoresist comprises forming a plurality of grating structures in a layer of photoresist.

41. The method of claim 39, wherein modifying at least one parameter of a stepper exposure process to be performed on at least one subsequently processed wafer comprises modifying at least one of a focal plane position, a tilt angle of a reticle, and a tilt angle of a wafer for at least one subsequently processed wafer.

42. The method of claim 39, wherein said formed grating structure is comprised of a plurality of line photoresist features.

43. The method of claim 39, wherein measuring light reflected off of said grating structure to generate the optical characteristic trace for said grating structure is performed after said layer of photoresist has been subjected to a post-exposure bake process and prior to said layer of photoresist being subjected to a development process.

44. The method of claim 39, wherein measuring light reflected off of said grating structure to generate an optical characteristic trace for said grating structure is performed after said layer of photoresist is subjected to a development process.

45. The method of claim 39, wherein comparing said generated optical characteristic trace to at least one optical characteristic trace that corresponds to a grating structure comprised of a plurality of photoresist features having a known profile comprises comparing said generated optical characteristic trace to at least one optical characteristic trace that corresponds to a grating structure comprised of a plurality of photoresist features having a known profile to determine at least one aspect of a profile of said plurality of photoresist features that comprise said formed grating structure.

46. The method of claim 39, wherein comparing the generated optical characteristic trace that corresponds to a grating structure comprised of a plurality of photoresist features having a known profile comprises comparing the generated optical characteristic trace for said formed grating structure to a target optical characteristic trace that is based upon at least one aspect of a profile of at least one feature in said layer of photoresist that comprises said formed grating structure.

* * * * *